United States Patent
Kuwajima

(10) Patent No.: US 7,083,859 B2
(45) Date of Patent: Aug. 1, 2006

(54) CONDUCTIVE POWDER AND METHOD FOR PREPARING THE SAME

(75) Inventor: Hideji Kuwajima, Hitachinaka (JP)

(73) Assignee: Hitachi Chemical Co., Ltd., Tokyo (JP)

( * ) Notice: Subject to any disclaimer, the term of this patent is extended or adjusted under 35 U.S.C. 154(b) by 0 days.

(21) Appl. No.: 10/885,478

(22) Filed: Jul. 7, 2004

(65) Prior Publication Data

US 2005/0034560 A1 Feb. 17, 2005

(30) Foreign Application Priority Data

Jul. 8, 2003 (JP) .............................. 2003-193527

(51) Int. Cl.
*B22F 1/02* (2006.01)
*B22F 1/00* (2006.01)
*B32B 15/02* (2006.01)

(52) U.S. Cl. .................. 428/570; 428/428; 428/551; 428/613; 428/673; 428/674; 75/247; 75/230

(58) Field of Classification Search .................... None
See application file for complete search history.

(56) References Cited

U.S. PATENT DOCUMENTS

| 5,178,909 A | * | 1/1993 | Hayashi | 427/216 |
| 5,766,739 A | * | 6/1998 | Funaki et al. | 428/201 |
| 5,840,432 A | * | 11/1998 | Hirai et al. | 428/570 |
| 5,951,918 A | * | 9/1999 | Kuwajima et al. | 174/257 |
| 6,120,708 A | * | 9/2000 | Ohshita et al. | 252/511 |
| 6,620,344 B1 | * | 9/2003 | Sano et al. | 252/512 |
| 6,855,892 B1 | * | 2/2005 | Komatsu et al. | 174/256 |
| 6,881,240 B1 | * | 4/2005 | Sano et al. | 75/255 |
| 6,889,433 B1 | * | 5/2005 | Enomoto et al. | 29/582 |
| 6,923,924 B1 | * | 8/2005 | Sano et al. | 252/512 |
| 2003/0089199 A1 | * | 5/2003 | Sano et al. | 75/373 |
| 2004/0046154 A1 | * | 3/2004 | McVicker et al. | 252/512 |
| 2004/0076863 A1 | * | 4/2004 | Baars et al. | 429/26 |

FOREIGN PATENT DOCUMENTS

JP  11-158501  *  7/1999

* cited by examiner

*Primary Examiner*—Jennifer McNeil
*Assistant Examiner*—Jason L. Savage
(74) *Attorney, Agent, or Firm*—Griffin & Szipl, P.C.

(57) ABSTRACT

Disclosed are conductive powder having a packing density of 68% by volume or more with a relative value preferably comprising 60 to 92% by weight of roughly spherical and silver-plated copper powder part of the surface of which has been coated with 3 to 30% by weight of silver based on an amount of roughly spherical copper powder with exposing at least a surface of a portion of an alloy of copper with silver, and the surface of which is coated with 0.02 to 1.0% by weight of an aliphatic acid based on an amount of the roughly spherical and silver-plated copper powder, and 8 to 40% by weight of silver powder, and a method for preparing the same.

4 Claims, 1 Drawing Sheet

CONDUCTIVE POWDER AND METHOD FOR PREPARING THE SAME

This application claims priority from Japanese Patent Application No. 2003-193527, filed Jul. 8, 2003, the entire disclosure of which is incorporated herein by reference.

BACKGROUND OF THE INVENTION

1. Field of the Invention

The present invention relates to conductive powder to be used for formation of a circuit of a wiring board, formation of a shield layer, formation of an electrode of electronic parts, formation of an electrode with solder, a conductive adhesive, a thermal conductive adhesive, etc., and a method for preparing the same.

2. Prior Art

As a method for forming a conductive circuit on a printed wiring board, there is a method in which conductive powder such as gold, silver, copper and carbon is used and mixed with a binder, an organic solvent and, an additive(s), if necessary, to prepare a paste state material and the material is applied to the board (see, for example, "Electronic Material", pp. 42–46, No. 10, 1994). In particular, in the field in which high conductivity is required, gold powder, silver powder, palladium powder or alloy powder thereof has been generally used.

Of these, a conductive paste containing silver powder has good conductivity, so that it has been used as a wiring layer (a conductive layer) for a printed wiring board, electronic parts, etc., or for forming an electric circuit or electrodes of electronic parts. However, when an electric field is applied thereto under atmosphere of high temperature and high humidity, electrodeposition of silver, which is so-called migration, occurs in the electric circuit or electrodes whereby there is a defect that short circuit between electrodes or wirings occur. To prevent from causing the migration, there have been investigated some measures, for example, a moistureproof coating is applied onto the surface of the conductive material or a corrosion preventive agent such as a nitrogen-containing compound is added to a conductive paste, but these measures are insufficient to obtain an effect. When a silver-palladium alloy powder is used in place of silver powder, migration resistance can be heightened, but silver and palladium are expensive, so that there is a defect that expensive silver-palladium alloy powder must be used.

Also, to obtain a conductive material having good conductive resistance, an amount of silver powder to be formulated must be increased but the silver powder is expensive, so that there is a defect that the conductive paste is also expensive. When silver-plated copper powder is used, migration can be prevented and an inexpensive conductive paste can be obtained. However, when the surface of the copper powder is coated with silver uniformly and thick, an improved effect in preventing from migration is not sufficient. Moreover, when soldering is carried out to a conductive paste using silver powder, there is a defect that sufficient conjugation cannot be carried out since silver is alloyed with the solder which is a phenomenon that silver is dissipated and dissolved in the solder to disappear.

On the other hand, there is a case wherein copper powder is used in addition to the silver powder. However, a conductive paste using the copper powder has an easily oxidizable property of copper after heat-curing, and oxygen contained in air and in a binder and the copper powder react to form an oxidized film on the surface thereof whereby the conductivity is markedly lowered. Thus, there is disclosed a copper paste to which various kinds of reducing agent(s) are added to prevent from oxidation on the surface of the copper powder to stabilize the conductivity. However, an effect to stabilize the conductivity does not cover the silver powder, and an electric resistance is increased in a high temperature and high humidity test, whereby there is a defect that the conductive circuit becomes a short-circuited state.

In the prior art, when the conventionally known conductive paste is used as an adhesive, it has a drawback that the conductive paste is expensive since the conductive powder is expensive as compared to a solder paste. Accordingly, it has been earnestly desired to develop a conductive adhesive that has higher reliability in conductive property than that of the copper paste, excellent migration resistance than the silver paste and has the same operatability in drying and curing as that of the solder paste.

Also, in an adhesive required to have thermal conductivity, a filler having good thermal conductivity such as powder of silver, copper, boron nitride, etc. must be mixed with a higher filling ratio, but if a formulation amount of the powder is increased, a viscosity thereof is also increased and fluidity thereof becomes poor, so that there is a defect that production and use of the paste become difficult.

As a method for forming a conductive circuit using a conductive paste, a conductive paste in which conductive powder is dispersed in a binder to make a paste state material is coated on the surface of a substrate (a board) 3 or filled with a through hole 4 as shown in FIG. 1 to form a conductive layer 1. Incidentally, the reference numeral 2 in FIG. 1 is a copper foil and 5 is an insulating layer.

Also, as another method for forming a conductive layer in a through hole formed in a printed wiring board, there is a method in which copper plating is applied on an inner surface of the through hole to form a conductive layer.

In general, when an interlayer connection is carried out by filling a conductive paste for filling a hole in a through hole, it requires high conductivity whereas it is a small hole, so that the conductive paste is filled in the hole as much as possible and the conductive paste must be buried therein without gap. Thus, the conventional conductive paste for filling a hole is required to have a high ratio of the conductive powder, but when the ratio of the conductive powder is made high, a viscosity of the conductive paste becomes high and a filling property to the hole becomes poor. On the other hand, when a ratio of the binder is made high, a viscosity of the same becomes low and a filling property to the hole is improved, but there is a defect that conductivity is lowered.

When a packing density of conductive powder is heightened, a viscosity of the conductive paste in which the conductive powder is formulated with a high ratio can be made low than in the case in which conductive powder having a low packing density is used, but in the prior art techniques, it was difficult to heighten its packing density. In particular, in the case of silver powder having good conductivity, silver is soft in hardness and when agglomerated powder is subjected to disagglomeration, deformation in shape of the powder occurs accompanying with the operation, so that it was difficult to obtain conductive powder having high packing density. A packing density of commercially available silver powder is generally about 55% by volume in a relative value, and at most 65% by volume or so, and thus, it is extremely difficult to obtain conductive powder having 68% by volume or more stably. In the present specification, the relative packing density by volume is calculated by dividing a tapping density of powder by a theoretical density of the powder.

SUMMARY OF THE INVENTION

The first and the second inventions are to provide conductive powder that is capable of formulating with a higher ratio, excellent in reliability of conductivity or migration resistance, and can heighten a price competition power by reducing an amount of silver to be used.

The third invention is to provide conductive powder excellent in high packing property and flowability in addition to the first and the second inventions.

The fourth invention is to provide conductive powder which is capable of high packaging in addition to the third invention.

The fifth invention is to provide a method for preparing conductive powder that is capable of formulating with a higher ratio, excellent in reliability of conductivity or migration resistance, and can heighten a price competition power by reducing an amount of silver to be used.

The first invention relates to conductive powder having a packing density of 68% by volume or more in a relative value.

The second invention also relates to conductive powder wherein the conductive powder comprises 60 to 92% by weight of roughly spherical and silver-plated copper powder part of the surface of which has been coated with 3 to 30% by weight of silver based on an amount of roughly spherical copper powder with exposing a surface of a portion of an alloy of copper with silver, and the surface of which is coated with 0.02 to 1.0% by weight of an aliphatic acid based on an amount of the roughly spherical and silver-plated copper powder, and the surface of the plated silver has been subjected to smoothening treatment, and 8 to 40% by weight of silver powder.

The third invention further relates to conductive powder, wherein the roughly spherical and silver-plated copper powder has an average particle size of 2 to 15 μm.

The fourth invention further relates to conductive powder, wherein the silver powder has a shape of roughly spherical or bulky and has an average particle size of $1/15$ to $2/5$ to that of the roughly spherical and silver-plated copper powder.

Moreover, the fifth invention relates to a method for preparing conductive powder which comprises the steps of:

coating at least part of a surface of roughly spherical copper powder with silver in an amount of 3 to 30% by weight of silver based on an amount of the copper powder while exposing at least a surface of an alloy portion of silver and copper to prepare roughly spherical and silver-plated copper powder, further coating a surface of the roughly spherical and silver-plated copper powder with an aliphatic acid in an amount of 0.02 to 1.0% by weight of the aliphatic acid based on an amount of the roughly spherical and silver-plated copper powder, subjecting to surface smoothening treatment of the coated layer of the silver, and uniformly mixing the copper powder which is roughly spherical and coated with silver and aliphatic acid in an amount of 60 to 92% by weight with silver powder in an amount of 8 to 40% by weight.

DESCRIPTION OF THE PREFERRED EMBODIMENTS

Figure 1:
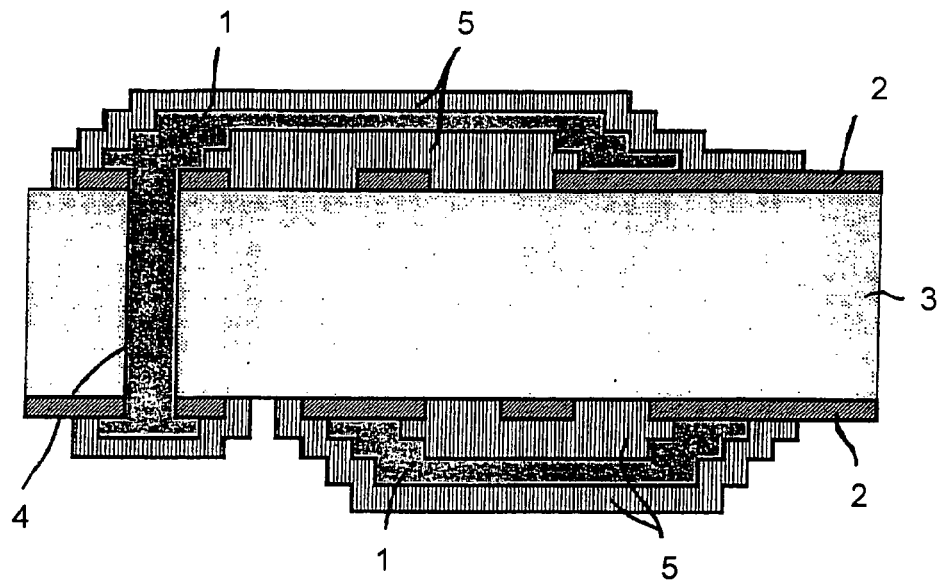
FIG. 1 is a sectional view showing the state in which a through hole and a surface of a wiring board are connected with a conductive paste.

A coated amount of silver on the surface of copper powder having roughly spherical shape is preferably in the range of 3 to 30% by weight, more preferably 5 to 22% by weight, further preferably 7.5 to 22% by weight based on the amount of the copper powder having roughly spherical shape. If the amount exceeds 30% by weight, conductivity and other properties are not improved and a cost becomes high, while if it is less than 3% by weight, conductivity is lost.

An average particle size of the copper powder having roughly spherical shape and coated with silver is preferably in the range of 2 to 15 μm, more preferably 4 to 7 μm in the points of handling such as printing, dispense, packaging property, etc., and a cost.

Also, a shape of the silver powder is preferably roughly spherical or bulk (massive) since increase in viscosity of a resulting paste can be prohibited. If the shape of the silver powder is scale, a packing density is lowered so that fluidity tends to be lowered when it is used in combination with the roughly spherical and silver-plated copper powder.

An average particle size of the silver powder is preferably in the range of $1/15$ to $2/5$ relative to an average particle size of the roughly spherical and silver-plated copper powder.

The average particle size herein mentioned in the present specification can be measured by a laser scattering type particle size distribution measurement device. In the present invention, measurement was carried out by using MASTER-SIZER (manufactured by MALVERN, Japan) as a measurement device.

In the present specification, the terms "roughly spherical" mean that the particle is not strictly true sphere but is substantially sphere shape which may have many unevennesses, and has an aspect ratio preferably within the range of 1 to 1.5, more preferably 1 to 1.3, further preferably 1 to 1.2.

The aspect ratio means a ratio of the longer diameter of a particle of the roughly spherical and silver-plated copper powder to the shorter diameter of the same (the longer diameter/the shorter diameter). In the present invention, the aspect ratio can be obtained by a method in which particles of the roughly spherical and silver-plated copper powder are mixed well with a curable resin having a low viscosity, the mixture is allowed to stand to sediment the particles, the resin is cured as such, and the resulting cured product is cut to a perpendicular direction. Then, the shape of the particles appearing at the sectional surface are observed by elongating with an electron microscope, and the longer diameter/the shorter diameter is measured with respect to each particle with a number of at least 100 particles, and an average value thereof is made the aspect ratio.

The above-mentioned shorter diameter can be determined as follows. With regard to particles appearing in the above-mentioned sectional surface, several kinds of parallel lines which come into contact with the outer surface of the particle are drawn, and a distance between parallel lines having the shortest distance of these parallel lines are selected as the shorter diameter. On the other hand, the longer diameter is a diameter obtained from parallel lines which are perpendicular to the parallel lines determining the shorter diameter, and the parallel lines which come into contact with the outer surface of the particle and having the longest distance between parallel lines. A rectangle formed from these two parallel lines has a size in which the particle is contained therein.

Incidentally, the specific method carried out in the present invention will be described later.

In the present invention, a method for covering silver on the surface of the roughly spherical copper powder is not specifically limited, and may be mentioned, for example, a displacement plating method, an electroplating method, an electroless plating method, etc. Of these, the displacement plating method is preferably used in the points that a cohesive strength between the roughly spherical copper powder and silver is high and running costs are inexpensive. The silver forms an alloy with the roughly spherical copper powder in part thereof during the above-mentioned coating step. In the present invention, the silver is coated in such a state that the surface of the alloy portion of the silver and copper and the surface of at least part of the roughly spherical copper powder are exposed. Thus, the surface of the alloy portion comprising the silver and copper is prevented from silver electromigration.

At the portion of the roughly spherical copper powder, a silver-copper alloy is formed partially at the surface of the roughly spherical copper powder when silver is plated on the roughly spherical copper powder, and at least part of the surface of the silver-copper alloy and at least part of the surface of the roughly spherical copper powder are in states of exposed to outside without plating with silver. In other words, at the surface of the roughly spherical and silver-plated copper powder, in addition to the surface of the plated silver, at least part of the surface of the silver-copper alloy formed at the silver plating and at least part of the surface of the roughly spherical copper powder are exposed. The exposed silver-copper alloy portion at the surface of the roughly spherical and silver-plated copper powder prevents from silver electromigration.

In the present invention, on the surface of the roughly spherical and silver-plated copper powder in which the surface of the roughly spherical copper powder is covered with silver, an aliphatic acid is further coated. As the aliphatic acid to be used in the present invention, a saturated aliphatic acid such as stearic acid, lauric acid, capric acid, palmitic acid, etc., and an unsaturated aliphatic acid such as oleic acid, linoleic acid, linolenic acid, sorbic acid, etc.

A coated amount of the aliphatic acid onto the surface of the roughly spherical and silver-plated copper powder is preferably in the range of 0.02 to 1.0% by weight, more preferably 0.02 to 0.5% by weight, further preferably 0.02 to 0.3% by weight based on an amount of the roughly spherical and silver-plated copper powder. If the coated amount of the aliphatic acid exceeds 1.0% by weight, the silver-plated copper powder particles are likely agglomerated by the presence of the aliphatic acid so that dis-agglomeration becomes difficult, and a cohesive strength is lowered since the aliphatic acid acts as an internal releasing agent. On the other hand, if a coated amount of the aliphatic acid is less than 0.02% by weight, it becomes difficult to dissociate agglomerated particles of the silver-plated copper powder particles to each other.

A surface state of the roughly spherical and silver-plated copper powder after silver plating is not plane since many particle grains of the silver deposited (or coated) exist on the surface thereof. Thus, when it is made a paste, a viscosity of the paste tends to be increased. Also, the particles are likely agglomerated during the plating treatment or drying step thereof, and a packing density is not so high that is generally 60% by volume or less, more specifically 55% by volume or less with a relative value. When the copper powder is subjected to dissociation treatment by using zirconia beads, glass beads, alumina beads, etc. to disagglomerate the coagulated particles and to smoothen the surface thereof, a packing density thereof can be heightened to 60 to 65% by volume with a relative value whereby conductive powder also improved in fluidity can be obtained. However, it was extremely difficult to heighten the packing density of 68% by volume or more with a relative value. Incidentally, to smoothen the surface of the coated silver can be carried out by using, for example, ball mill, etc.

In the present invention, the step of coating the surface of the roughly spherical and silver-plated copper powder with an aliphatic acid is carried out as follows. That is, after plating with silver, washing water is thrown away by decantation, and then, a water-soluble organic solvent is added to the wet powder and the mixture is stirred and settled. The mixture of water and the organic solvent is thrown away by decantation, and this operation is repeated twice or three times. Then, an organic solvent containing a predetermined amount of an aliphatic acid is added to the wet silver-plated copper powder and the organic solvent is dried by heating to obtain an aliphatic acid-coated powder.

When the surface of the roughly spherical and silver-plated copper powder is coated with an aliphatic acid, the following merits can be obtained. That is, when the roughly spherical copper powder is subjected to silver plating, a water component contained in the copper powder is dried in the subsequent drying step. When the water component is directly dried at this time, however, a latent heat for evaporation of water is large, so that a longer time is required for drying and conductive powder particles are agglomerated to each other. However, when the water component is previously replaced with a hydrophilic organic solvent such as alcohol, acetone, etc., and the organic solvent is removed, then, drying is easily carried out and agglomeration of the conductive powder particles is also lowered. The present invention utilizes the above fact and the aliphatic acid is formulated with the above-mentioned organic solvent to make drying easy. Moreover, by setting the coated amount of the aliphatic acid in the range as mentioned above and coating uniformly, agglomeration of the roughly spherical and silver-plated copper powder particles can be easily dissociated and a roughly spherical and silver-plated copper powder further coated with an aliphatic acid having a high packing density can be obtained without lowering a cohesive strength. Furthermore, a roughly spherical and silver-plated copper powder further coated with an aliphatic acid which is easily wettable with a resin solution can be obtained.

As the conductive powder to be used in the present invention, the above-mentioned roughly spherical and silver-plated copper powder further coated with an aliphatic acid and silver powder are used.

A formulation ratio of the roughly spherical and silver-plated copper powder further coated with an aliphatic acid and the silver powder is preferably 60 to 92% by weight of the roughly spherical and silver-plated copper powder further coated with an aliphatic acid and 8 to 40% by weight of the silver powder, more preferably 65 to 80% by weight of the roughly spherical and silver-plated copper powder further coated with an aliphatic acid and 20 to 35% by weight of the silver powder. If an amount of the roughly spherical and silver-plated copper powder further coated with an aliphatic acid is less than 60% by weight and that of the silver powder exceeds 40% by weight, reliability in conductive property causes no problem, but migration resistance is sometimes lowered and the packing density tends to be lowered. On the other hand, if an amount of the roughly spherical and silver-plated copper powder further coated with an aliphatic acid exceeds 92% by weight and that of the silver powder is less than 8% by weight, migration resistance is good but the packing density tends to be lowered.

Also, the packing density of the resulting conductive powder is 68% by volume or more with a relative value. If the packing density is less than 68% by volume, the packing density is low, so that a formulation ratio of the conductive powder must be high. However, when the formulation ratio of the conductive powder is made high, a viscosity of a conductive paste becomes high. On the other hand, if a formulation ratio of the conductive powder is made low, sufficient conductivity and reliability tend to be not obtained.

Incidentally, a relative value of the packing density means a value obtained by dividing a tap density calculated from a volume and a weight by carrying out 1000 times of tapping with a stroke of 25 mm by true density or theoretical density of a particle.

The conductive powder of the present invention comprises powder in which the surface of the roughly spherical and silver-plated copper powder is coated with 0.02 to 1.0% by weight of an aliphatic acid based on an amount of the roughly spherical and silver-plated copper powder, and the silver-plated on the roughly spherical copper powder has been subjected to smoothening treatment. Thus, silver powder and the roughly spherical and silver-plated copper powder having similar average particle size to that of the silver powder are used as dispersing media, and mixed and dispersed, deformation of the silver powder at the time of dissociating particles of the fine silver powder particles agglomerated can be prevented, and disagglomeration of the coagulated particles and uniform mixing can be carried out simultaneously. Accordingly, it is not necessary to carry out an operation of separating the dispersing media and mixed powder. The fine silver powder particles tend to be easily agglomerated and likely cause re-agglomeration even when a dissociation treatment is carried out. However, in the present invention, the dissociation operation and mixing operation of two kinds of powders are carried out simultaneously, so that a mixed conductive powder having a high packing density can be prepared without causing deformation of the fine silver powder particles.

A dispersing and mixing operation can be easily carried out by using a rotation or vibration energy such as a ball mill, a rocking mill, a V blender, a vibration mill, etc. By using a similar device as mentioned above, agglomerated fine silver powder particles can be dispersed and dissociated by using the roughly spherical and silver-plated copper powder after dissociation as a dispersing medium and simultaneously dispersed. A device and a method to be applied to the above are not specifically limited.

EXAMPLES

In the following, the present invention is explained by referring to Examples.

Example 1

A roughly spherical and silver-plated copper powder (680 g, manufactured by Hitachi Chemical Co., Ltd., GB05K, trade name, average particle size: 5.5 μm, aspect ratio: 1.0, a relative value of a packing density: 63% by volume) prepared by coating with a silver-plated amount of 20% by weight on roughly spherical copper powder, then, coating stearic acid which is an aliphatic acid thereon in an amount of 0.2% by weight based on an amount of the roughly spherical and silver-plated copper powder and further subjecting to surface treatment of the coating layer of silver by a ball mill, and 320 g of roughly spherical silver powder having an average particle size of 1.4 μm (manufactured by Metalor Technologies, U.S.A., K-0082P, trade name, a relative value of a packing density: 58% by volume) were weighed and charged in a ball mill having an inner volume of 3 liters, and the materials were mixed and dispersed by rotating the ball mill with a rotation number of 65 $min^{-1}$ for 100 hours to obtain a conductive powder. A relative value of a packing density of the resulting conductive powder was 71% by volume. Also, a ratio of an average particle size of the roughly spherical silver powder and that of the roughly spherical and silver-plated copper powder was 1.4/5.5.

On the other hand, 38 parts by weight of an alkoxyl group-containing resol type phenol resin (a trial product prepared by Hitachi Chemical Co., Ltd., a carbon number of the alkoxyl group is 4, an alkoxylation degree: 65%, weight average molecular weight: 1,200), 57 parts by weight of a bisphenol F type epoxy resin having an epoxy equivalent of 170 g/eq (available from Mitsui Chemicals Inc., Epomic R110, trade name) and 5 parts by weight of 2-phenyl-4-methyl-imidazol (available from Shikoku Corp., Curesol 2P4MZ, trade name) were uniformly mixed to prepare a binder.

To 50 g of the binder obtained above were added 450 g of the conductive powder obtained above and 15 g of ethyl-carbitol as a solvent, and the mixture was mixed and dispersed by a stirrer and three roll mixer to obtain a conductive paste. A viscosity of the conductive paste was 350 dPa·s at 25° C., and its thixotropic property was a thixotropic index of 4.6.

Figure 2:
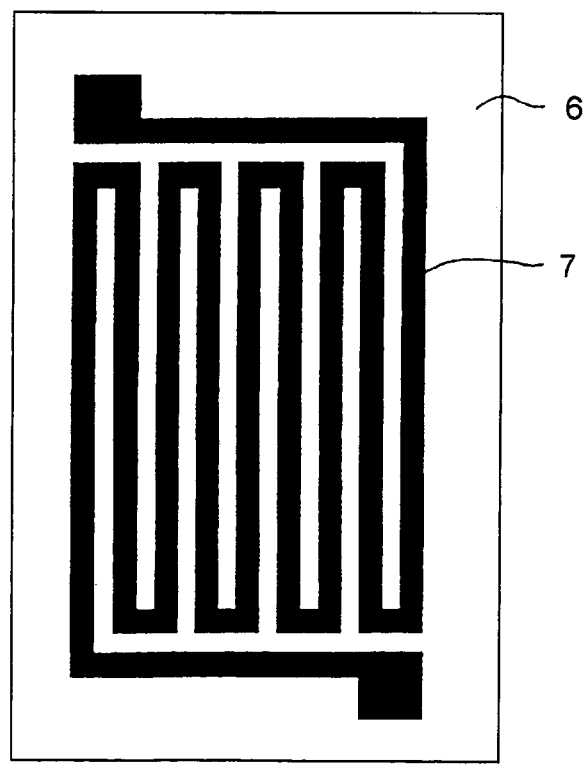
FIG. 2 is a plan view showing the state in which a test pattern is formed on a polyimide film.

Next, by using the conductive paste obtained as mentioned above, a test pattern 7 was printed on a polyimide film 6 shown in FIG. 2, and after placing the material in an oven, it was heated to 170° C. over 13 minutes, and subjected to heat treatment at the same temperature for 1 hour to prepare a test substrate.

When a sheet resistance of the conductor with regard to the resulting test substrate was measured, it was 95 mΩ/□. This test substrate was subjected to a reliance test in a constant temperature and constant humidity test for 4,000 hours and a gas phase thermal-shock test for 3,000 cycles. As a result, changed ratios of the circuit resistance were 10.4% and 9.1%, respectively. In the above-mentioned constant temperature and constant humidity test, the substrate was stored at 85° C. and 85% relative humidity, and the gas phase thermal-shock test was carried out −65° C. for 30 minutes and 125° C. for 30 minutes as one cycle (hereinafter the same).

Also, on a glass substrate with a thickness of 1.0 mm was printed a pattern for migration resistance test of comb-shaped electrodes with a distance between electrodes of 2.0 mm, and a heat treatment was carried out under the same conditions as mentioned above to cure the film and to prepare a substrate for migration resistance test. Migration resistance of the test substrate was tested by a water drop method (hereinafter the same). That is, a filter paper is placed on the electrodes of the test substrate, and after wetting the filter paper by adding distilled water dropwise, and a short-circuit current was measured by applying electrodes with a bias voltage of 20 V. As a result of measuring a time until the short-circuit current becomes 500 mA (hereinafter referred to as "short-circuit time"), it was 5 minutes and 50 seconds, which was about 13 times a silver paste (26 seconds) using silver powder as the conductive powder, whereby good results can be obtained.

Incidentally, specific measurement method of the aspect ratio according to the present invention is shown below. 8 g of a main agent (No. 10-8130) of an epoxy resin (available from BUHLER Co.) with a low viscosity and 8 g of a curing agent (No. 10-8132) are mixed, 2 g of conductive powder was mixed therewith and the resulting mixture was well dispersed. The mixture was as such degassed under vacuum at 25° C., and then, allowed to stand under the conditions at 25° C. for 10 hours to precipitate particles and the mixture was cured. Thereafter, the resulting cured product was cut to perpendicular direction, the sectional surface was magnified by an electron microscope to 1000-fold, and with regard to 150 particles appeared at the sectional surface, their longer diameter/shorter diameter were obtained. The average value thereof was made an aspect ratio.

Example 2

610 g of the roughly spherical and silver-plated copper powder treated by stearic acid used in Example 1 and 390 g of roughly spherical silver powder having an average particle size of 0.95 μm (available from Tokuriki Kagaku Kenkyusho, AgS-052L, trade name, relative value of a packing density: 51% by volume) were weighed, and mixing and dispersion were carried out by rotating the mixture in a ball mill similar to that used in Example 1 under the same conditions as those of Example 1 for 150 hours to obtain conductive powder. A packing density of the resulting conductive powder was 69% by volume in a relative value. A ratio of an average particle size of the roughly spherical silver powder and that of the roughly spherical and silver-plated copper powder was 0.95/5.5.

Using the conductive powder obtained as mentioned above, a conductive paste was prepared in the same manner as in Example 1. Further, a test substrate was prepared, and a sheet resistance and migration resistance of the conductive material were tested. As a result, the sheet resistance of the test substrate was 86 mΩ/□. Changed ratios of the circuit resistances after the constant temperature and constant humidity test and the gas phase thermal-shock test carried out under the same conditions as in Example 1 were 8.7% and 7.3%, respectively.

Also, a short-circuit time when the test substrate was tested by the water drop method under the same conditions as in Example 1 was 9 minutes and 10 seconds, which was 20-fold or more longer than that of the silver paste. Incidentally, a viscosity of the conductive paste obtained by mixing and dispersing was 470 dPa·s at 25° C. and a thixotropic property was a thixotropic index of 4.9.

Example 3

770 g of the roughly spherical and silver-plated copper powder treated by stearic acid used in Example 1 and 230 g of roughly spherical silver powder having an average particle size of 1.0 μm (available from FUKUDA METAL FOIL & POWDER CO.,LTD., AgC-1561, trade name, relative value of a packing density: 56% by volume) were weighed, and mixing and dispersion were carried out by rotating the mixture in a ball mill similar to that used in Example 1 under the same conditions as those of Example 1 for 200 hours to obtain conductive powder. A packing density of the resulting conductive powder was 71% by volume in a relative value. A ratio of an average particle size of the roughly spherical silver powder and that of the roughly spherical and silver-plated copper powder was 1.0/5.5.

Using the conductive powder obtained as mentioned above, a conductive paste was prepared in the same manner as in Example 1. Further, a test substrate was prepared, and a sheet resistance and migration resistance of the conductive material were tested. As a result, the sheet resistance of the test substrate was 90 mΩ/□. Changed ratios of the circuit resistances after the constant temperature and constant humidity test and the gas phase thermal-shock test carried out under the same conditions as in Example 1 were 8.9% and 7.8%, respectively.

Also, a short-circuit time when the test substrate was tested by the water drop method under the same conditions as in Example 1 was 9 minutes and 40 seconds, which was 20-fold or more longer than that of the silver paste.

Incidentally, a viscosity of the conductive paste obtained by mixing and dispersing was 330 dPa·s at 25° C. and a thixotropic property was a thixotropic index of 4.5.

Example 4

A roughly spherical and silver-plated copper powder (700 g, manufactured by Hitachi Chemical Co., Ltd., GB10K, trade name, average particle size: 10.8 μm, aspect ratio: 1.0, a relative value of a packing density: 64% by volume) prepared by coating with a silver-plated amount of 20% by weight on roughly spherical copper powder, then, coating stearic acid which is an aliphatic acid thereon in an amount of 0.05% by weight based on an amount of the roughly spherical and silver-plated copper powder and further subjecting to surface treatment of the coating layer of silver by a ball mill, and 300 g of roughly spherical silver powder having an average particle size of 1.4 μm (manufactured by Metalor Technologies, U.S.A., K-0082P, trade name, a relative value of a packing density: 58% by volume) were weighed and charged in a ball mill having an inner volume of 2 liters, and the materials were mixed and dispersed by rotating the ball mill with a rotation number of 56 min$^{-1}$ for 90 hours to obtain a conductive powder. A relative value of a packing density of the resulting conductive powder was 76% by volume. Also, a ratio of an average particle size of the roughly spherical silver powder and that of the roughly spherical and silver-plated copper powder was 1.4/10.8.

Using the conductive powder obtained as mentioned above, a conductive paste was prepared in the same manner as in Example 1. Further, a test substrate was prepared, and a sheet resistance and migration resistance of the conductive paste were tested. As a result, the sheet resistance of the test substrate was 75 mΩ/□. Changed ratios of the circuit resistances after the constant temperature and constant humidity test and the gas phase thermal-shock test carried out under the same conditions as in Example 1 were 6.5% and 5.8%, respectively.

Also, a short-circuit time when the test substrate was tested by the water drop method under the same conditions as in Example 1 was 9 minutes and 50 seconds, which was 20-fold or more longer than that of the silver paste.

Incidentally, a viscosity of the conductive paste obtained by mixing and dispersing was 420 dPa·s at 25° C. and a thixotropic property was a thixotropic index of 4.3.

Example 5

A roughly spherical and silver-plated copper powder (800 g, manufactured by Hitachi Chemical Co., Ltd., GB10K, trade name, average particle size: 11.2 μm, aspect ratio: 1.0, a relative value of a packing density: 63% by volume) prepared by coating with a silver-plated amount of 20% by weight on roughly spherical copper powder, then, coating oleic acid which is an aliphatic acid thereon in an amount of 0.1% by weight based on an amount of the roughly spherical and silver-plated copper powder and further subjecting to surface treatment of the coating layer of silver by a ball mill, and 200 g of roughly spherical silver powder having an average particle size of 1.4 μm (manufactured by Metalor Technologies, U.S.A., K-0082P, trade name, a relative value of a packing density: 58% by volume) were weighed and charged in a ball mill having an inner volume of 2 liters, and the materials were mixed and dispersed by rotating the ball mill with a rotation number of 56 $min^{-1}$ for 90 hours to obtain a conductive powder. A relative value of a packing density of the resulting conductive powder was 76% by volume. Also, a ratio of an average particle size of the roughly spherical silver powder and that of the roughly spherical and silver-plated copper powder was 1.4/11.2.

Using the conductive powder obtained as mentioned above, a conductive paste was prepared in the same manner as in Example 1. Further, a test substrate was prepared, and a sheet resistance and migration resistance of the conductive paste were tested. As a result, the sheet resistance of the test substrate was 84 mΩ/□. Changed ratios of the circuit resistances after the constant temperature and constant humidity test and the gas phase thermal-shock test carried out under the same conditions as in Example 1 were 8.6% and 7.9%, respectively.

Also, a short-circuit time when the test substrate was tested by the water drop method under the same conditions as in Example 1 was 9 minutes and 50 seconds, which was 20-fold or more longer than that of the silver paste. Incidentally, a viscosity of the conductive paste obtained by mixing and dispersing was 400 dPa·s at 25° C. and a thixotropic property was a thixotropic index of 4.2.

Example 6

A roughly spherical and silver-plated copper powder (910 g, manufactured by Hitachi Chemical Co., Ltd., GB10K, trade name, average particle size: 11.6 μm, aspect ratio: 1.0, a relative value of a packing density: 64% by volume) prepared by coating with a silver-plated amount of 20% by weight on roughly spherical copper powder, then, coating stearic acid which is an aliphatic acid thereon in an amount of 0.05% by weight based on an amount of the roughly spherical and silver-plated copper powder and further subjecting to surface treatment of the coating layer of silver by a ball mill, and 90 g of roughly spherical silver powder having an average particle size of 1.4 μm (manufactured by Metalor Technologies, U.S.A., K-0082P, trade name, a relative value of a packing density: 58% by volume) were weighed and charged in a ball mill having an inner volume of 2 liters, and the materials were mixed and dispersed by rotating the ball mill with a rotation number of 56 $min^{-1}$ for 90 hours to obtain a conductive powder. A relative value of a packing density of the resulting conductive powder was 68% by volume. Also, a ratio of an average particle size of the roughly spherical silver powder and that of the roughly spherical and silver-plated copper powder was 1.4/11.6.

Using the conductive powder obtained as mentioned above, a conductive paste was prepared in the same manner as in Example 1. Further, a test substrate was prepared, and a sheet resistance and migration resistance of the conductive paste were tested. As a result, the sheet resistance of the test substrate was 97 mΩ/□. Changed ratios of the circuit resistances after the constant temperature and constant humidity test and the gas phase thermal-shock test carried out under the same conditions as in Example 1 were 9.6% and 9.7%, respectively.

Also, a short-circuit time when the test substrate was tested by the water drop method under the same conditions as in Example 1 was 14 minutes and 30 seconds, which was 30-fold or more longer than that of the silver paste.

Incidentally, a viscosity of the conductive paste obtained by mixing and dispersing was 400 dPa·s at 25° C. and a thixotropic property was a thixotropic index of 3.5.

Example 7

A roughly spherical and silver-plated copper powder (600 g, manufactured by Hitachi Chemical Co., Ltd., GB10K, trade name, average particle size: 10.8 μm, aspect ratio: 1.0, a relative value of a packing density: 63% by volume) prepared by coating with a silver-plated amount of 20% by weight on roughly spherical copper powder, then, coating stearic acid which is an aliphatic acid thereon in an amount of 0.3% by weight based on an amount of the roughly spherical and silver-plated copper powder and further subjecting to surface treatment of the coating layer of silver by a ball mill, and 400 g of roughly spherical silver powder having an average particle size of 1.4 μm (manufactured by Metalor Technologies, U.S.A., K-0082P, trade name, a relative value of a packing density: 58% by volume) were weighed and charged in a ball mill having an inner volume of 2 liters, and the materials were mixed and dispersed by rotating the ball mill with a rotation number of 56 $min^{-1}$ for 90 hours to obtain a conductive powder. A relative value of a packing density of the resulting conductive powder was 74% by volume. Also, a ratio of an average particle size of the roughly spherical silver powder and that of the roughly spherical and silver-plated copper powder was 1.4/10.8.

Using the conductive powder obtained as mentioned above, a conductive paste was prepared in the same manner as in Example 1. Further, a test substrate was prepared, and a sheet resistance and migration resistance of the conductive paste were tested. As a result, the sheet resistance of the test substrate was 68 mΩ/□. Changed ratios of the circuit resistances after the constant temperature and constant humidity test and the gas phase thermal-shock test carried out under the same conditions as in Example 1 were 4.7% and 5.2%, respectively.

Also, a short-circuit time when the test substrate was tested by the water drop method under the same conditions as in Example 1 was 6 minutes and 50 seconds, which was 15-fold or more longer than that of the silver paste.

Incidentally, a viscosity of the conductive paste obtained by mixing and dispersing was 510 dPa·s at 25° C. and a thixotropic property was a thixotropic index of 4.5.

Comparative Example 1

450 g of the roughly spherical and silver-plated copper powder treated by stearic acid used in Example 1 and 50 g of roughly spherical silver powder used in Example 1 were weighed, and mixing and dispersion were carried out by rotating the mixture in a ball mill similar to that used in Example 1 under the same conditions as those of Example 1 for 100 hours to obtain conductive powder. A packing density of the resulting conductive powder was 60% by volume in a relative value.

Using the conductive powder obtained as mentioned above, a conductive paste was prepared in the same manner as in Example 1. Further, a test substrate was prepared, and a sheet resistance and migration resistance of the conductive material were tested. As a result, the sheet resistance of the test substrate was as extremely high as 340 m$\Omega$/□. Changed ratios of the circuit resistances after the constant temperature and constant humidity test and the gas phase thermal-shock test carried out under the same conditions as in Example 1 were 88.2% and 105.3%, respectively, which were significantly high values as compared to those of Examples 1 to 3.

Also, a short-circuit time when the test substrate was tested by the water drop method under the same conditions as in Example 1 was 13 minutes and 50 seconds, which was 30-fold or more longer than that of the silver paste.

Incidentally, a viscosity of the conductive paste obtained by mixing and dispersing was 420 dPa·s at 25° C. and a thixotropic property was a thixotropic index of 3.5.

Comparative Example 2

900 g of the roughly spherical and silver-plated copper powder treated by stearic acid used in Example 1 and 100 g of roughly spherical silver powder used in Example 3 were weighed, and mixing and dispersion were carried out by rotating the mixture in a ball mill similar to that used in Example 1 under the same conditions as those of Example 1 for 200 hours to obtain conductive powder. A packing density of the resulting conductive powder was 67% by volume in a relative value.

Using the conductive powder obtained as mentioned above, a conductive paste was prepared in the same manner as in Example 1. Further, a test substrate was prepared, and a sheet resistance and migration resistance of the conductive material were tested. As a result, the sheet resistance of the test substrate was 70 m$\Omega$/□. Changed ratios of the circuit resistances after the constant temperature and constant humidity test and the gas phase thermal-shock test carried out under the same conditions as in Example 1 were 5.1% and 4.5%, respectively.

Also, a short-circuit time when the test substrate was tested by the water drop method under the same conditions as in Example 1 was 4 minutes and 40 seconds, which was about 10-fold or more longer than that of the silver paste.

Incidentally, a viscosity of the conductive paste obtained by mixing and dispersing was 520 dPa·s at 25° C. and a thixotropic property was a thixotropic index of 3.9.

Comparative Example 3

550 g of the roughly spherical and silver-plated copper powder treated by stearic acid used in Example 1 and 450 g of roughly spherical silver powder used in Example 2 were weighed, and mixing and dispersion were carried out by rotating the mixture in a ball mill similar to that used in Example 1 under the same conditions as those of Example 1 for 200 hours to obtain conductive powder. A packing density of the resulting conductive powder was 63% by volume in a relative value.

Using the conductive powder obtained as mentioned above, a conductive paste was prepared in the same manner as in Example 1. Further, a test substrate was prepared, and a sheet resistance and migration resistance of the conductive material were tested. As a result, the sheet resistance of the test substrate was 70 m$\Omega$/□. Changed ratios of the circuit resistances after the constant temperature and constant humidity test and the gas phase thermal-shock test carried out under the same conditions as in Example 1 were 5.1% and 4.5%, respectively.

Also, a short-circuit time when the test substrate was tested by the water drop method under the same conditions as in Example 1 was 4 minutes and 40 seconds, which was 10-fold or more longer than that of the silver paste.

Incidentally, a viscosity of the conductive paste obtained by mixing and dispersing was 870 dPa·s at 25° C. and a thixotropic property was a thixotropic index of 5.3.

The invention claimed is:

1. Conductive powder having a packing density of 68% by volume or more with a relative value, wherein the conductive powder comprises:
   60 to 92% by weight of roughly spherical and silver-plated copper powder, part of the surface of which has been coated with 3 to 30% by weight of silver based on an amount of roughly spherical copper powder by exposing at least a surface of a portion of an alloy of copper to silver, and the surface of which is coated with 0.02 to 1.0% by weight of an aliphatic acid based on an amount of the roughly spherical and silver-plated copper powder, and the surface of the plated silver has been subjected to smoothening treatment; and
   8 to 40% by weight of silver powder.

2. The conductive powder according to claim 1, wherein the roughly spherical and silver-plated copper powder has an average particle size of 2 to 15 µm.

3. The conductive powder according to claim 1, wherein the silver powder has a shape of roughly spherical or bulky and has an average particle size of 1/15 to 2/5 to that of the roughly spherical and silver-plated copper powder.

4. The conductive powder according to claim 2, wherein the silver powder has a shape of roughly spherical or bulky and has an average particle size of 1/15 to 2/5 to that of the roughly spherical and silver-plated copper powder.

* * * * *